(12) United States Patent
Warnes et al.

(10) Patent No.: US 6,911,234 B2
(45) Date of Patent: Jun. 28, 2005

(54) CHEMICAL VAPOR DEPOSITION APPARATUS AND METHOD

(75) Inventors: Bruce M. Warnes, Muskegon, MI (US); Andrew L. Purvis, New Era, MI (US); Daniel L. Near, Montague, MI (US)

(73) Assignee: Howmet Corporation, Cleveland, OH (US)

( * ) Notice: Subject to any disclaimer, the term of this patent is extended or adjusted under 35 U.S.C. 154(b) by 0 days.

(21) Appl. No.: 10/852,079

(22) Filed: May 24, 2004

(65) Prior Publication Data

US 2005/0000439 A1 Jan. 6, 2005

Related U.S. Application Data

(63) Continuation of application No. 09/950,013, filed on Sep. 10, 2001, now Pat. No. 6,793,966.

(51) Int. Cl.$^7$ ............................................. C23C 16/08
(52) U.S. Cl. ...................... 427/248.1; 427/252; 427/253
(58) Field of Search ............................. 427/248.1, 252, 427/253

(56) References Cited

U.S. PATENT DOCUMENTS

| | | | |
|---|---|---|---|
| 2,567,932 A | 9/1951 | Garbo | |
| 2,849,293 A | 8/1958 | Wendell et al. | 422/202 |
| 3,284,163 A | 11/1966 | Noel | |
| 3,492,097 A | 1/1970 | Moles et al. | 422/109 |
| 3,764,371 A | 10/1973 | Baldi | 117/71 M |
| 4,112,148 A | 9/1978 | Fonzi | 427/255.32 |
| 4,134,360 A | 1/1979 | Fisher et al. | 118/49.1 |
| 4,148,275 A | 4/1979 | Benden et al. | 118/49.5 |
| 4,264,682 A | 4/1981 | Ura | |
| 4,401,689 A | 8/1983 | Ban | 427/45.1 |
| 4,421,786 A | 12/1983 | Mahajan et al. | 427/82 |
| 4,427,720 A | 1/1984 | Gauje | 427/237 |
| 4,468,283 A | 8/1984 | Ahmed | 156/642 |
| 4,469,508 A | 9/1984 | Cavadias | |
| 4,580,524 A | 4/1986 | Lackey, Jr. et al. | 118/725 |
| 4,698,244 A | 10/1987 | Benander et al. | |
| 4,745,088 A * | 5/1988 | Inoue et al. | 117/98 |
| 4,747,368 A | 5/1988 | Brien et al. | 118/715 |
| 4,788,082 A | 11/1988 | Schmitt | 427/248.1 |
| 4,890,574 A | 1/1990 | Sarin et al. | 118/719 |
| 4,895,108 A | 1/1990 | Caputo et al. | 118/728 |
| 4,926,793 A | 5/1990 | Arima et al. | 118/730 |
| 5,062,386 A | 11/1991 | Christensen | 118/725 |
| 5,071,678 A | 12/1991 | Grybowski et al. | 427/253 |
| 5,146,869 A | 9/1992 | Bohannon et al. | 118/724 |
| 5,154,907 A | 10/1992 | Kim et al. | |
| 5,221,354 A | 6/1993 | Rigney | 118/725 |
| 5,227,195 A | 7/1993 | Sanjurjo | |
| 5,250,323 A | 10/1993 | Miyazaki | 427/255.1 |

(Continued)

FOREIGN PATENT DOCUMENTS

| | | |
|---|---|---|
| EP | 0572150 | 12/1993 |
| EP | 1013794 | 6/2000 |
| EP | 1209247 | 5/2002 |
| GB | 2236694 | 4/1991 |
| JP | 60110475 | 11/1986 |
| JP | 62290121 | 5/1989 |
| JP | 03107635 | 8/1994 |
| WO | WO97/35045 | 9/1997 |
| WO | WO01/34871 | 5/2001 |

OTHER PUBLICATIONS

U.S. Appl. No. 09/950,012, filed Sep. 2001.

Primary Examiner—Timothy Meeks
(74) Attorney, Agent, or Firm—Edward J. Timmer; Gary P. Topolosky; Eckert Seamans Cherin & Mellott, LLC

(57) ABSTRACT

Chemical vapor deposition apparatus and method are provided with coating gas distribution and exhaust systems that provide more uniform coating gas temperature and coating gas flow distribution among a plurality of distinct coating zones disposed along the length of a coating chamber.

2 Claims, 3 Drawing Sheets

U.S. PATENT DOCUMENTS

| | | | |
|---|---|---|---|
| 5,264,245 A | * 11/1993 | Punola et al. | 427/237 |
| 5,279,670 A | 1/1994 | Watanabe et al. | 118/725 |
| 5,348,774 A | 9/1994 | Golecki et al. | 427/543 |
| 5,362,228 A | 11/1994 | Vaudel | 432/120 |
| 5,407,704 A | 4/1995 | Basta et al. | 427/248.1 |
| 5,455,071 A | 10/1995 | Pillhoefer et al. | 427/253 |
| 5,462,013 A | 10/1995 | Punola et al. | 118/719 |
| 5,480,678 A | 1/1996 | Rudolph et al. | 427/248.1 |
| 5,531,971 A | 7/1996 | Tom et al. | 423/210 |
| 5,683,669 A | 11/1997 | Hartmann et al. | 423/491 |
| 5,837,320 A | 11/1998 | Hampden-Smith et al. | 427/248.1 |
| 5,904,957 A | 5/1999 | Christin et al. | 427/248.1 |
| 5,916,633 A | 6/1999 | Lackey et al. | 427/249 |
| 5,928,725 A | 7/1999 | Howard et al. | 427/237 |
| 5,948,300 A | 9/1999 | Gero et al. | 219/390 |
| 5,976,919 A | 11/1999 | Hirao et al. | 438/158 |
| 5,989,733 A | 11/1999 | Warnes et al. | 428/652 |
| 5,993,599 A | 11/1999 | Maginsky et al. | 156/345.11 |
| 6,120,843 A | 9/2000 | Pillhoefer et al. | 427/253 |
| 6,139,641 A | 10/2000 | Inokuchi et al. | 118/724 |
| 6,143,361 A | 11/2000 | Near et al. | 427/248.1 |
| 6,156,123 A | 12/2000 | Pillhoefer et al. | 118/715 |
| 6,451,692 B1 | 9/2002 | Derderian et al. | 438/680 |

* cited by examiner

CHEMICAL VAPOR DEPOSITION APPARATUS AND METHOD

This is a continuation of Ser. No 09/950,013 filed Sep. 10, 2001, now U.S. Pat. No. 6,793,966.

FIELD OF THE INVENTION

The present invention relates to a chemical vapor deposition (CVD) apparatus and method for applying coatings to substrates.

BACKGROUND OF THE INVENTION

Chemical vapor deposition (CVD) involves the generation of metal halide gas at low temperatures (e.g. about 100 to 600 degrees C.), introduction of the metal halide gas into a high temperature retort (e.g. 200 to 1200 degrees C. retort temperature), and reaction of the metal halide with substrates positioned in the retort to form a coating thereon. In general, a large excess of metal halide gas is used to prevent reactant starvation in the high temperature coating retort. CVD processes typically are conducted at reduced pressure (subambient pressure). CVD apparatus and method are described in Howmet U.S. Pat. Nos. 5,261,963 and 5,263,530. Howmet U.S. Pat. No. 6,143,361 described CVD apparatus and method wherein deposition of excess metal halide reactant in the coating gas exhausted from the coating retort is reduced or eliminated to reduce retort downtime required to remove deposits from the retort exhaust system.

The CVD process can be used to codeposit Al, Si, and one or more reactive elements such as Hf, Zr, Y, Ce, La, etc. to form protective aluminide diffusion coatings on substrates such as nickel and cobalt base superalloys commonly used to cast gas turbine engine airfoils. Copending U.S. Ser. Nos. 08/197,497 and 08/197,478 disclose CVD apparatus and method to produce protective reactive element-modified aluminide diffusion coatings. U.S. Pat. No. 5,989,733 describes a protective outwardly grown, platinum-modified aluminide diffusion coating containing Si and Hf and optionally Zr, Y, Ce, and/or La formed on a nickel or cobalt base superalloy substrate by such CVD apparatus and process.

There is a need to provide improved CVD apparatus and method that are capable of producing aluminide diffusion coatings modified by inclusion of one or more other coating elements, such as for example only silicon and one or more so-called reactive elements, wherein the coatings can be produced having a more uniform coating composition, microstructure, and thickness throughout the working volume (throughout multiple coating zones) of the CVD coating apparatus. It is an object of the present invention to satisfy this need.

SUMMARY OF THE INVENTION

In one embodiment of the present invention, CVD apparatus and method are provided with an improved coating gas distribution system to provide more uniform coating gas temperature among a plurality of coating zones in a coating chamber.

In another embodiment of the present invention, CVD apparatus and method are provided with an improved coating gas distribution system to provide more uniform flow of coating gas among a plurality of coating zones in the coating chamber.

In still another embodiment of the present invention, CVD apparatus and method are provided with an improved coating gas exhaust system that reduces interaction between the inlet coating gas flow to each coating zone and exhaust gas flow from each coating zone so as provide a more uniform gas flow pattern in each coating zone.

The above and other objects and advantages of the present invention will become more readily apparent from the following detailed description taken with the following drawings.

DESCRIPTION OF THE INVENTION

For purposes of illustration and not limitation, the present invention will be described herebelow with respect to a CVD apparatus and method for producing a protective platinum-modified aluminide diffusion coating containing Si, Hf and optionally Zr on a nickel base superalloy substrate of the type disclosed in U.S. Pat. No. 5,989,733, the teachings of which are incorporated herein by reference. Zr can be present in the coating as a result of being an impurity in the Hf pellets described below or as an intentional coating addition. The invention is not limited to making such coatings and can be practiced to form other coatings on other substrates.

Figure 1:
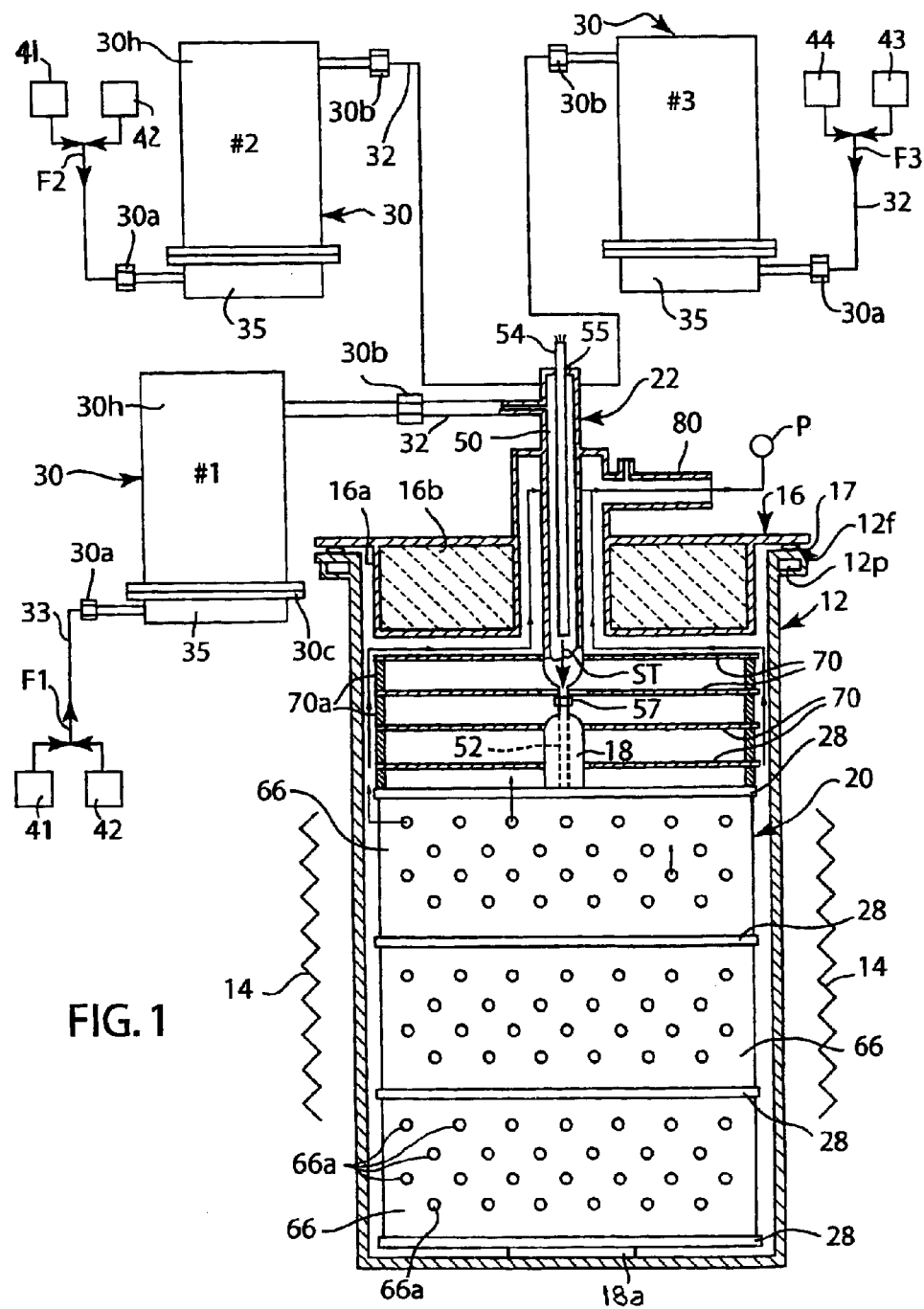
FIG. 1 is a somewhat schematic view of a CVD coating gas generator and a coating reactor chamber that is shown in a longitudinal sectional view pursuant to an embodiment of the invention.
Figure 2:
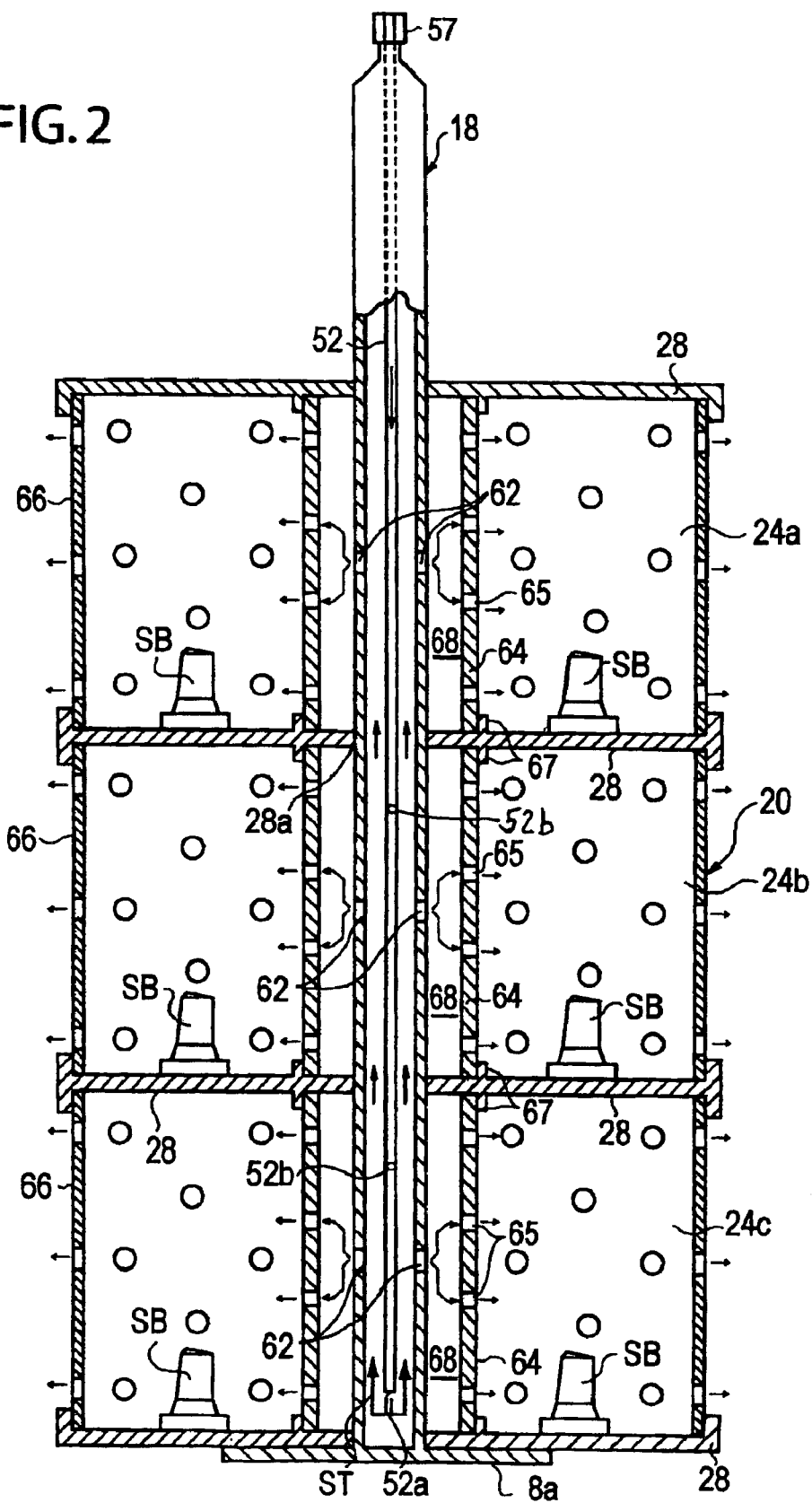
FIG. 2 is an enlarged longitudinal sectional view of the coating reactor chamber and coating gas distribution system pursuant to an embodiment of the invention.

Referring to FIGS. 1–2, CVD coating apparatus pursuant to an embodiment of the invention comprises a reactor or retort 12 adapted to be disposed in a refractory-lined heating furnace 14 shown schematically that is used to heat the retort 12 to an elevated CVD coating temperature. The furnace 14 can be an electrical resistance or other known type of furnace to this end. Metallic substrates SB to be coated are placed in a coating reactor chamber 20 disposed in the retort 12 and are heated by radiation from the walls of the heated retort.

The retort 12 includes a lid 16 to close off the upper end of the retort. To this end, the retort lid 16 is air-tight sealed on a flange 12f of the retort by an O-ring seal 17. The flange 12f includes an annular water cooling passage 12p through which passage water is circulated to cool the flange during operation of the retort. Lid 16 includes an annular chamber 16a receiving a thermal insulation block or member 16b therein to reduce heat losses from the retort. Components of the coating reactor chamber 20 can be supported on the lid 16 and then lowered with lid 16 into the retort 12. The coating reactor chamber 20 includes conduits 18, 22 joined at connection 57, which connection is made prior to closing the lid 16 on the retort 12. Conduit 22 is part of the retort cover 16 as a result of being welded thereto.

The retort lid 16 includes central coating gas inlet conduit 22 through which reactive coating gases are supplied to the axial gas preheat and distribution conduit 18 of the reactor 20 as described below. The conduit 18 includes an inner axial gas preheat conduit 52 therein. The coating reactor chamber 20 comprises a plurality of distinct annular coating zones 24a, 24b, 24c (FIG. 2) at different axial elevations in the retort and disposed about coating gas preheat and distribution pipe or conduit 18. Referring to FIG. 2, substrates SB to be coated are disposed on trays 28 in the coating zones 24a, 24b, 24c. The trays 28 close off the coating zones 24a, 24b, 24c. The coating zones are shown disposed one atop another for purposes of illustration and not limitation since fewer or greater number of coating zones can be employed in practice of the invention.

Figure 3:
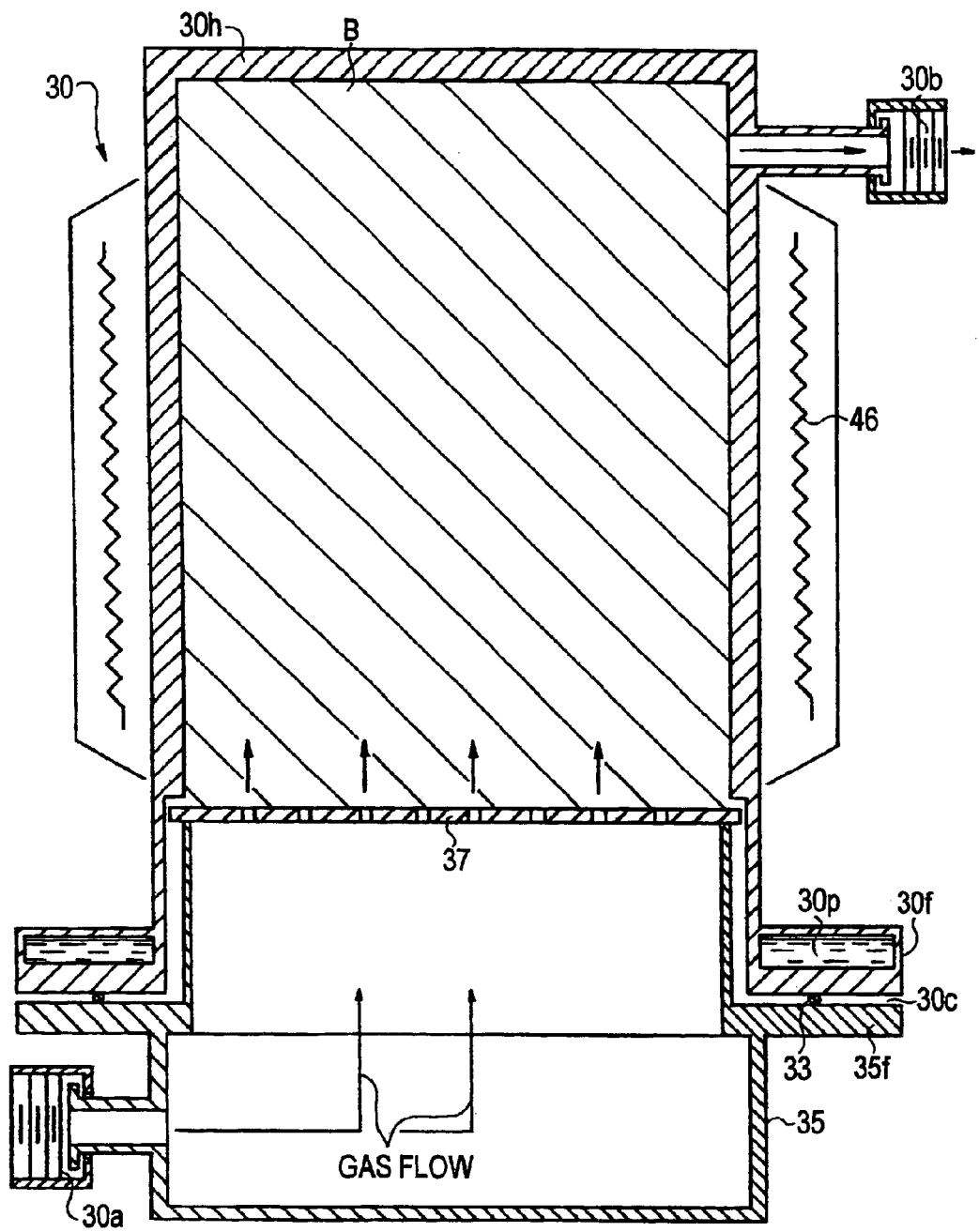
FIG. 3 is an enlarged longitudinal sectional view of the external coating gas generator.

Referring to FIG. 1, the coating gas inlet conduit 22 is communicated to a plurality of low temperature metal halide generators 30 of identical construction with the exception of the metal charge B therein, FIG. 3. The metal charge B in each generator 30 is different and selected to generate a particular coating gas constituent, such as for purposes of illustration and not limitation, an aluminum or aluminum alloy pellet bed in generator #1 to generate aluminum trichloride or other volatile aluminum halide coating gas constituent, a silicon or silicon alloy pellet bed in generator #2 to generate silicon tetrachloride or other volatile silicon halide coating gas constituent, and a reactive element, such as Hf or an alloy thereof, in generator #3 to generate a hafnium tetrachloride or other volatile hafnium halide coating gas constituent. Other reactive elements that can be used in lieu of, or in addition to Hf or its alloys, include Zr and its alloys, Ce and its alloys, and Ni—Mg alloys to generate a Mg-bearing coating gas.

The generators 30 are located externally of the retort 12 and connected to inlet conduit 22 via heated conduits 32. The conduits 32 are heated by conventional heating devices, such as electrical resistance heated flexible tapes or electrical resistance heated rods or sticks, to prevent condensation of the metal halide coating gases therein.

For producing a protective platinum-modified aluminide diffusion coating containing Si, Hf and Zr on a nickel base superalloy substrate of the type disclosed in U.S. Pat. No. 5,989,733, the first metal halide generator #1 is used to generate aluminum trichloride or other aluminum halide coating gas constituent. The generator is supplied with a gas flow F1 comprising a mixture of an acid halide gas, such as typically HCl or other hydrogen halide gas, and a reducing or inert carrier gas, such as hydrogen, argon, helium, or mixtures thereof, via conduits 33 from suitable sources 41, 42, such as respective high pressure cylinders or bulk cryogenic supplies. The acid halide gas and carrier gas are blended together in suitable proportions to provide the gas flow F1 to the first generator.

Referring to FIG. 3, the first generator #1 includes a bed B of aluminum metal pellets and an heating device 46, such as an electrical resistance heater, to heat the Al pellets to a reaction temperature depending upon the acid halide gas supplied to the generator. For example only, an aluminum pellet temperature of about 200 degrees C. or higher can be used for HCl gas. The pellet temperature for other hydrogen halide gases depends on the boiling point of the aluminum halide formed in the generator. The acid halide gas/carrier gas flow F1 is supplied to generator #1 to flow over the Al pellets under conditions of temperature, pressure, and flow rate to form aluminum trichloride or other aluminum halide gas, depending on the hydrogen halide gas used, in the carrier gas. Typical temperature, pressure, and flow rate to form aluminum trichloride at generator #1 are as taught in U.S. Pat. No. 5,658,614 as follows:

Hydrogen halide/carrier gas—13 vol. % HCl; balance $H_2$
Pellet temperature—290 degrees C.
Flow rate—46 scfh (standard cubic feet per hour)

The second metal halide generator #2 is used to generate silicon tetrachloride or other volatile silicon halide coating gas constituent. The generator is supplied with a gas flow F2 comprising a mixture of an hydrogen halide gas, such as typically HCl gas, and a reducing or inert carrier gas, such as hydrogen, helium and argon, or mixtures thereof, from suitable sources 41, 42, such as respective high pressure cylinders or bulk cryogenic supplies. The hydrogen halide gas and carrier gas are blended together in suitable proportions to provide the gas flow F2 to the second generator. The second generator #2 includes a bed B of silicon pellets and heating device 46, such as an electrical resistance heater, to heat the Si pellets to a reaction temperature depending upon the acid halide gas supplied to the generator. For example only, a silicon pellet temperature of about 100 degrees C. or higher can be used for HCl gas. Pellet temperatures for other hydrogen halide gases depends on the boiling points of the silicon halide formed in the generator. Typical temperature, pressure, and flow rate to form silicon tetrachloride at generator #2 are as follows:

Hydrogen halide/carrier gas—2 vol. % HCl; balance $H_2$
Pellet temperature—290 degrees C.
Flow rate—26 scfh The third metal halide generator #3 is used to generate a reactive element chloride or other reactive element halide gas, such as hafnium tetrachloride coating gas constituent. The generator is supplied with a gas flow F3 comprising a mixture of an acid halide gas, such as typically HCl gas, and an inert carrier gas, such as argon, helium, or mixtures thereof, from suitable sources 43, 44, such as respective high pressure cylinders or bulk cryogenic supplies. The hydrogen halide gas and carrier gas are blended together in suitable proportions to provide the gas flow F3 to the first generator. The third generator #3 includes a bed B of hafnium pellets containing natural Zr impurities and heating device 46, such as an electrical resistance heater, to heat the Hf pellets to a reaction temperature depending upon the acid halide gas supplied to the generator. For example only, a hafnium pellet temperature of about 430 degrees C. can be used for HCl gas. Pellet temperatures for other hydrogen halide gases depends on the boiling or sublimation points of the metal halide formed in the generator. The pellets of the bed in generator #3 can comprise an alloy of Hf and Zr in the event Zr is to be intentionally present as an alloyant in the coating. Typical temperature, pressure, and flow rate to form hafnium tetrachloride at generator #3 are as follows:

Acid halide/carrier gas—3 vol. % HCl; balance Ar
Pellet temperature—430 degrees C.
Flow rate—33 scfh In lieu of having three separate generators, a cogenerator can be used to cogenerate two metal halide gases. For example, aluminum trichloride and silicon tetrachloride can be cogenerated by flowing a hydrogen halide/carrier gas mixture first over a bed of Al pellets and then over a bed of Si pellets located downstream of the bed of aluminum pellets as described in copending application Ser. No. 08/197 478, the teachings of which are incorporated herein by reference, to generate a coating gas constituent that includes both $AlCl_3$ and $SiCl_4$ in proportions controlled by the flow rate of the acid halide/carrier gas over the beds. The third generator #3 would still be used to generate the $HfCl_4$ coating gas constituent. Alternately, hafnium tetrachloride and silicon tetrachloride can be cogenerated by flowing a hydrogen halide/carrier gas mixture first over a bed of Hf pellets and then over a bed of Si pellets located downstream of the bed of hafnium pellets. Any combination of pellet beds where metal halide gas from the first upstream bed is more stable than a second metal halide formed in the second downstream bed can be used as a cogenerator in practice of the invention The coating gas constituents from generators 30 are supplied to the inlet conduit 22 connected to the gas preheat and distribution conduit 18 at connection 57. A suitable pump P, such as vacuum pump, is connected to the exhaust 80 of the reactor coating chamber in a manner to maintain a desired pressure, desired flow rate of the gases through the generators 30 and the coating chamber 20 and to exhaust spent coating gas from the coating chamber.

The metal halide generators 30 are constructed to reduce leakage of air into the generators at the inlet fitting 30a, outlet fitting 30b and flange joint 30c thereof. Each generator 30 is identical to the other except for the bed B of pellets therein.

In FIG. 3, generator 30 is shown including a metal (e.g. stainless steel) housing 30h having electrical resistance heating device 46 disposed thereabout to heat the bed B in the generator to a desired reaction temperature; for example, as described above. The housing 30h includes an annular, laterally extending flange region 30f at a lower end to rest on a generator base 35 with an O-ring seal 33 therebetween. The flange region 30f resting on base 35 defines joint 30c. The flange 30f includes an annular passage 30p through which cooling fluid (e.g. water) is flowed during operation of the generator to cool the flange and maintain its temperature in the range of about 40 to about 100 degrees C. for purposes of illustration and not limitation. Cooling of flange region 30f during operation of the generator 30 reduces distortion of the flange region 30f from the elevated temperature of the housing 30h during generator operation, and minimizes oxidation of the O-ring.

The O-ring seal 33 is compressed between the cooled flange region 30f and flange 35f of the generator base 35 to provide an air-tight seal therebetween. The O-ring seal comprises an acid resistant fluoroelastomer polymeric material that does not release carbon, sulfur or other unwanted tramp element into the generator 30 that could adversely affect the coating produced on substrates SB. A suitable O-ring 33 is commercially available as a Viton O-ring from Dupont Dow Elastomers, Wilmington, Del. More than one O-ring seal 33 can be provided between flange region 30f and base 35.

The inlet fitting 30a on base 35 and outlet fitting 30b on housing 30h of the generator 30 comprise commercially available zero clearance fittings that provide knife-edge sealing surfaces (not shown) that penetrate into an annular nickel gasket (not shown) to provide an air-tight seal. Suitable zero clearance fittings 30a, 30b are available as VCR metal gasket and face seal fittings from Swagelok Corporation, Solon, Ohio.

The bed B of pellets is disposed on a perforated gas distribution plate 37 that is positioned further downstream of the flange region 30f; i.e. downstream in the direction of flow of the gases in the generator, so as to reduce heat input to the flange region 30f and O-ring seal 33. In the past as disclosed in U.S. Pat. Nos. 5,407,704 and 5,264,245, the plate 37 was positioned at the flange region 30f having a grafoil gasket that emitted carbon and sulfur into the generator. The plate 37 is heated by contact with the bed B of pellets in the generator and by proximity to the heater 46 such that the more remote positioning of the plate 37 from the flange region 30f reduces heat input to the flange region 30f and O-ring seal 33. A typical spacing of the gas distribution plate 37 from the flange region 30f is 1 inch or more for purposes of illustration and not limitation.

Reduction of air leaks into the generators 30 at the flange joint 30f and fitting 30a reduces oxidation of the pellet charge forming bed B. Thus, the efficiency of utilization of the pellet charges is increased. For example, the efficiency of use of the hafnium pellet charge in generator #3 was improved from less than 5% to more than 98% by prevention of air leaks into the third generator 30. Reduction of air leaks into the coating gas conduit at fitting 30b prevents oxidation of the reactive element halides exiting the generator and so improves control of the coating composition.

Pursuant to an embodiment of the present invention, an improved coating gas distribution system is provided to provide more uniform coating gas temperature among the coating zones 24a, 24b, 24c in the coating chamber 20. In particular, the coating gas constituents (e.g. $AlCl_3$, $SiCl_4$, $HfCl_4$ and carrier gases) are conveyed to inlet conduit 22 which defines a gas manifold 50 that is located above and upstream of the coating chamber 20 in the retort 12 and that communicates with upstanding inner coating gas preheat conduit 52 inside coating gas preheat and distribution conduit 18 such that the coating gas stream ST (comprising the coating gas constituents) entering the inlet conduit 22 flows through the manifold 50 and down the preheat conduit 52 to the lowermost coating zone 24c of the coating chamber 20 and back up in the annular space between the conduits 18 and 52 in a manner that the coating gas stream ST is preheated before entering the coating zones 24a, 24b, 24c via conduit 18. The manifold 50 includes a heater device 54, such an elongated electrical resistance heater, suspended therein such that gas stream ST flows about the heater device 54 to heat the gas stream ST. A suitable electrical resistance heater that can be placed in manifold 50 is commercially available as Firerod Cartridge from Watlow Corporation, St. Louis, Mo., although other heating devices can be used to this end. The heater device 54 can be suspended along the length of the manifold 50 by a conventional swaglock compression connection 55.

The inlet conduit 22 communicates to preheat conduit 52 that resides inside coating gas preheat and distribution conduit or pipe 18. The conduit 22 and conduits 18, 52 are connected by a union type pipe fitting connection 57.

The conduit 52 extends axially through and along the length of the retort 12 through the coating zones 24a, 24b, 24c disposed along the length of the coating chamber 20 to the lowermost coating zone 24c where the conduit 52 includes a lower gas discharge opening 52a to discharge the coating gas stream ST into the annular space between the gas preheat and distribution conduit or pipe 18 and preheat conduit 52 for flow upwardly in the annular space to the coating zones as illustrated by the arrows.

For purposes of illustration and not limitation, the exemplary coating gas stream ST described above (e.g. $AlCl_3$, $SiCl_4$, $HfCl_4$ and carrier gases) can be preheated to a gas temperature of greater than 100 degrees C. by the heater device 54 in the manifold 50 and the heating provided by flowing the stream through conduits 18, 52 in the above described manner when the coating chamber 20 is at a temperature of 1080 degrees C.

In addition, radiant heat shields 70 are provided above the coating zones 24a, 24b, 24c to reduce heat losses from the top of the coating chamber 20. The heat shields 70 comprise stainless steel plates fastened in the parallel arrangement illustrated above the coating chamber 20 to reflect radiant heat energy back toward the coating chamber 20. The heat shields 70 include legs 70a spaced circumferentially about their peripheries so that the plates 70 can stacked atop one another on the upper tray 28. Such radiant heat shields 70 can be used in lieu of the gettering screens described in U.S. Pat. No. 5,407,704.

Preheating of the coating steam ST using the heater device 54 in the manifold 50 and using the heating provided by flowing the stream through conduits 18, 52 in the above described manner as well as reduction of radiant heat losses from the coating chamber 20 by shields 70 improves uniformity of the coating gas temperature in the coating zones 24a, 24b, 24c to dramatically reduce coating thickness variations on substrates SB from one coating zone to the next. That is, the coating gas stream ST is more uniformly heated in the retort 12 to the desired coating deposition temperature prior to its being directed into the coating zones 24a, 24b, 24c by practice of this embodiment of the invention. For purposes of illustration and not limitation, a coating gas stream temperature gradient of only 50 degrees F. over the length of the coating chamber 20 can be provided as compared to a 400 degrees F. temperature gradient experienced in CVD apparatus of the type illustrated in U.S. Pat. Nos. 5,407,704 and 5,264,245.

Once the coating gas stream ST has reached a desired reaction or coating temperature, another embodiment of the invention provides an improved coating distribution system to provide more uniform distribution of the preheated coating gas stream among the coating zones 24a, 24b, 24c in the coating chamber 20.

In particular, the preheat and distribution conduit 18 extends axially through the annular substrate support trays 28 which define therebetween the distinct annular coating zones 24a, 24b, 24c about pipe or conduit 18. The pipe or conduit 18 includes at a mid-point of the height of each coating zone 24a, 24b, 24c a plurality of circumferentially spaced apart gas discharge holes or openings 62 to discharge the preheated coating gas stream ST to each coating zone. The number of openings 62 at each coating zone can be varied as desired. For a diameter of conduit 18 of 1½ inches and axial spacing of 6 inches between trays 28, three or more openings 62 can be provided in conduit 18. The area of the openings 62 (e.g. number of holes) at the coating zones 24a, 24b, 24c is systemically varied to provide equal coating gas flow from conduit 18 to each coating zone. Typically, the number of openings 62 at coating zone 24a are greater than those at coating zone 24b, and the number of holes 62 at coating zone 24b is greater than those at coating zone 24c. For example only, the number of holes at coating zone 24a can be 10, the number of holes at coating zone 24b can be 8, and the number of holes at coating zone 24c can be 6.

The conduit 52 also includes one or more bleed openings 52b above the lower primary coating gas discharge opening 52a for discharging coating gas along the length of conduit 52. For example, one bleed opening 52b is located at coating zone 24b and one bleed opening 52b is located at coating zone 24c to assist in providing generally equal flow of coating gas among the coating zones 24a, 24b, 24c. Although one bleed opening 52b is shown at each coating zone 24b and 24c in the upper region of each coating zone 24b, 24c to this end, more than one bleed opening can be provided at the same or different locations at coating zones 24a, 24b, 24c as needed to generally equalize the flow of coating gas among the coating zones 24a, 24b, 24c. The coating gas discharged from bleed openings 52b flows upwardly in conduit 18 to this end. Bleed openings 52b each having a diameter of 0.125 inch can be provided to this end for use with conduits 18, 52 having dimensions described herein.

The annular trays 28 are spaced axially apart proximate their inner circumference by upstanding spacer annular inner walls 64 and proximate their outer circumference by upstanding outer perforated baffles 66. The spacer walls 64 are positioned symmetrically about pipe or conduit 18 by retaining rings 67 welded or otherwise provided on trays 28.

The trays 28 include a central hole 28a having inner diameter about equal to the outer diameter of pipe or conduit 18 to receive same in manner that the trays 28 are symmetrically disposed about the pipe or conduit 26. The trays 28, spacer walls 64, and baffles 66 are stacked atop one another and supported on a lowermost, laterally flange 18a of the pipe or conduit 18. The gas distribution pipe or conduit 18, trays 28, spacer walls 64 and baffles 66 thereby are arranged in fixed positions symmetrically about the central longitudinal axis of the coating chamber 20.

The spacer walls 64 form an annular gas manifold 68 at each coating zone 24a, 24b, 24c between the pipe or conduit 18 and walls 64 each of which provides a manifold wall. Each spacer wall 64 opposes or faces the gas discharge openings 62 of the pipe or conduit 18 at that coating zone. Each spacer wall 64 includes first and second sets of circumferentially spaced apart gas flow opening openings 65 located an equal distance above and below the height of the openings 62 in pipe or conduit 18. Each spacer wall 64 thereby is provided with a plurality of gas flow openings 65 that are out of alignment with the gas discharge openings 62 at each coating zone such that there is no line-of-sight gas flow path from the gas discharge openings 62 to gas flow openings 65 at each coating zone.

For purposes of illustration and not limitation, 48 gas flow openings 65 having a diameter of 0.25 inches can be provided in each wall 64 at each coating zone 24a, 24b, 24c when the conduit 18 includes opening 62 whose number and diameters are described above. Locating the openings 62 of the gas distribution pipe or conduit 18 midway between the sets of openings 65 prevents gas jets from flowing directly across the each coating zone. Also, deflection of the coating gas off of the inside of the wall 64 at each coating zone produces more uniform gas flow about the circumference of each coating zone 24a, 24b, 24c.

The above gas distribution system provides a uniform and repeatable gas flow to the coating zones 24a, 24b, 24c to improve coating composition and microstructure uniformity among substrates SB on the same tray 28 and among substrates in different coating zones.

Once the coating gas stream ST has flowed over the substrates SB on trays 28 at each coating zone 24a, 24b, 24c, still another embodiment of the present invention provides an improved spent gas exhaust system to provide less interaction between the inlet coating gas flow to each coating zone 24a, 24b, 24c and the exhaust gas flow from each coating zone so as provide a more uniform flow pattern of coating gas in the coating zones.

In particular, perforated tubular baffles 66 are provided between the trays 28 at their outer circumferences as shown in FIG. 1–2. The tubular baffles 66 comprise IN-600 nickel base superalloy and include patterns of exhaust openings 66a through which spent (exhaust) gas from the coating zones 24a, 24b, 24c is exhausted. The pattern of openings 66a as well as their number and size (e.g. diameter) can be selected to provide more or less uniform gas flow pattern at each coating zone 24a, 24b, 24c. For purposes of illustration and not limitation, a suitable pattern of openings 66a is shown in FIG. 1 wherein each baffle 66 includes 90 openings 66a with each opening having a diameter of 0.375 inch. Such baffles 66 can be used with the diameters and numbers of openings 62 on pipe or conduit 18 and openings 65 on spacer walls 64 described above to provide a more uniform gas flow pattern from the inner to the outer circumference of each coating zone 24a, 24b, 24c to in turn improve uniformity in the composition and microstructure of the diffusion aluminide coating (or other coating) formed on the substrates SB.

The spent gas exhausted through baffle openings 66a flows to an exhaust tube or conduit 80 that communicates to exhaust gas treatment equipment as described in U.S. Pat. No. 6,143,361, the teachings of which are incorporated herein by reference. The countercurrent flow of exhaust gas outside of inlet conduit 22 helps preheat the coating gas flowing therethrough via heat exchange between the exhaust gas and coating gas in conduit 22. Although the invention has been described with respect to certain embodiments, those skilled in the art will appreciate that the invention is not so limited to these embodiments since changes, modifications, and the like can be made thereto within the scope of the invention as set forth in the appended claims.

We claim:

1. A method of chemical vapor deposition, comprising flowing coating gas in a gas distribution conduit in a coating chamber, discharging the coating gas laterally from the gas distribution conduit to an annular manifold located about the gas distribution conduit laterally between the gas distribution conduit and an annular coating zone and having gas flow openings of the manifold communicated to the coating zone, and exhausting spent coating gas from the coating zone through openings in an annular baffle located about and outwardly of the coating zone.

2. A method of chemical vapor deposition, comprising flowing coating gas in a gas distribution conduit in a heated coating chamber, discharging the coating gas from the gas distribution conduit laterally through gas discharge openings at an opposing manifold wall of an empty manifold disposed laterally between a coating zone and said gas distribution conduit, and flowing the coating gas through a plurality of gas flow openings disposed in the manifold wall to the coating zone with the gas flow openings being out of alignment with said gas discharge openings such that there is no line-of-sight gas flow path from said gas discharge openings to said gas flow openings through said empty manifold to the coating zone.

* * * * *